United States Patent
Lacroix et al.

(10) Patent No.: US 9,553,600 B1
(45) Date of Patent: Jan. 24, 2017

(54) SKEW DETECTION AND CORRECTION IN TIME-INTERLEAVED ANALOG-TO-DIGITAL CONVERTERS

(71) Applicants: Marc-Andre Lacroix, Carp (CA); Henry Wong, Nepean (CA); Davide Tonietto, Ottawa (CA)

(72) Inventors: Marc-Andre Lacroix, Carp (CA); Henry Wong, Nepean (CA); Davide Tonietto, Ottawa (CA)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/187,161

(22) Filed: Jun. 20, 2016

(51) Int. Cl.
*H03M 1/06* (2006.01)
*H03M 1/12* (2006.01)
*H03M 1/00* (2006.01)
*H04L 7/00* (2006.01)

(52) U.S. Cl.
CPC ......... *H03M 1/0624* (2013.01); *H03M 1/1215* (2013.01); *H03M 1/00* (2013.01); *H03M 1/12* (2013.01); *H03M 1/1225* (2013.01); *H04L 7/0008* (2013.01)

(58) Field of Classification Search
CPC ........ H03M 1/00; H03M 1/12; H03M 1/1225; H04L 7/0008
USPC ......... 341/118, 120, 122, 141, 155; 375/354
See application file for complete search history.

(56) References Cited

U.S. PATENT DOCUMENTS

2010/0060557 A1* 3/2010 Hsu ...................... G09G 3/3688
345/87

OTHER PUBLICATIONS

Jamal et al., "A 10-b 120-Msample/s Time-Interleaved Analog-to-Digital Converter With Digital Background Calibration", IEEE Journal of Solid-State Circuits, vol. 37, No. 12, Dec. 2002, pp. 1618-1627.
Huang et al., "A CMOS 6-Bit 16-GS/s Time-Interleaved ADC Using Digital Background Calibration Techniques", IEEE Journal of Solid-State Circuits, vol. 46, No. 4, Apr. 2011, pp. 848-858.
Razavi, "Problem of Timing Mismatch in Interleaved ADCs", Proceedings of the IEEE 2012 Custom Integrated Circuits Conference, Sep. 2012, pp. 1-8.

* cited by examiner

*Primary Examiner* — Joseph Lauture
(74) *Attorney, Agent, or Firm* — Norton Rose Fulbright Canada LLP (57) ABSTRACT

The present disclosure provides a system, circuit, and method for correcting clock skew in time-interleaved analog-to-digital converters. At least two clock signals are received along respective channels. A delay of a first channel, carrying a first clock signal, is accounted for by applying one or more first adjustment factors to the channels until an edge of the first clock signal is aligned with a transition point of a reference signal. The first clock signal is swapped to the second channel, and vice-versa. A value of the reference signal as sampled by the first clock signal is compared to values of the reference signal as sampled by the second clock signal to determine a skew of the second channel vis-à-vis the first channel, and one or more second adjustment factors are applied to the second channel based on the determined skew of the second channel.

20 Claims, 11 Drawing Sheets

FIGURE 9

## SKEW DETECTION AND CORRECTION IN TIME-INTERLEAVED ANALOG-TO-DIGITAL CONVERTERS

TECHNICAL FIELD

The present disclosure relates generally to electronic circuits, and more specifically to skew detection and correction techniques.

BACKGROUND OF THE ART

While events and phenomena in the real world take place in analog spaces, most processing of information regarding the real world is performed using digital information. A variety of methods exist for transforming analog information into digital information, including using transducers with analog-to-digital converters (ADCs). The transducer first converts a physical response into an analog electrical signal, and the ADC samples the analog electrical signal to obtain a plurality of values which form a digital representation of the analog electrical signal.

One parameter which governs the operation of an ADC is the sampling rate, namely the rate at which values of the analog electrical signal are acquired by the ADC. For example, the sampling rate of an ADC may be based on a frequency of a digital clock provided to the ADC. In certain situations, multiple ADCs are used to sample a single analog electrical signal. Each ADC is provided a clock which is offset from clocks provided to the other ADCs, such that each ADC samples at a different time. Such a system is referred to as a time-interleaved ADC (TIADC). Clock skew arises when the clocks provided to the ADCs of a TIADC are not correctly offset.

A number of techniques currently exist for correcting clock skew. For example, the skew can be converted to a DC quantity by performing digital-domain mixing, but this method is only applicable to sinusoids, requires full bit-width multipliers, and may require a finite-impulse response filter to properly correct for clock skew. Alternatively, clock skew can be corrected by comparing the average zero-crossing difference between adjacent samples of ADCs, but this technique cannot be used in situations where a reference signal and sampling clocks are synchronous. Alternatively still, the correlation difference between two adjacent samples can be computed: if this average difference is null, there is no skew. However, this procedure requires two full bitwidth multipliers, which have a high gate count, making them difficult to implement in dense, multi-channel transceiver applications. Moreover, this approach can be ineffective when used with full-bandwidth input.

As such, there is a need for improved clock skew correction techniques which can be used in TIADCs.

SUMMARY

The present disclosure provides a system, circuit, and method for correcting clock skew in time-interleaved analog-to-digital converters. At least two clock signals are received along respective channels. A delay of a first channel, carrying a first clock signal, is accounted for by applying one or more first adjustment factors to the channels until an edge of the first clock signal is aligned with a transition point of a reference signal. The first clock signal is swapped to the second channel, and vice-versa. A value of the reference signal as sampled by the first clock signal is compared to values of the reference signal as sampled by the second clock signal to determine a skew of the second channel vis-à-vis the first channel, and one or more second adjustment factors are applied to the second channel based on the determined skew of the second channel.

In accordance with a broad aspect, there is provided a method for correcting clock skew in a time-interleaved analog-to-digital converter (TIADC). The method comprises: receiving at least first and second clock signals along first and second channels, respectively; accounting for a delay of the first channel by applying at least one first adjustment factor to the first and second channels until an edge of the first clock signal is aligned with a transition point of a reference signal; swapping the first and second clock signals to provide the first clock signal on the second channel and the second clock signal on the first channel; determining, based on a comparison of at least one value of the reference signal sampled by the first clock signal to at least two values of the reference signal sampled by the second clock signal, a skew of the second channel; and applying at least one second adjustment factor to the second channel based on the determined skew of the second channel.

In some embodiments, at least one of applying the at least one first adjustment factor and applying the at least one second adjustment factor comprises adjusting at least one of an infinite delay block and a variable delay line.

In some embodiments, adjusting at least one of an infinite delay block and a variable delay line comprises: performing a first adjustment using a master clock and data recovery unit to adjust the infinite delay block; and performing a second adjustment using the variable delay line.

In some embodiments, the reference signal is an output signal of the TIADC.

In some embodiments, the output signal is synchronous with the first and second clock signals.

In some embodiments, swapping the first and second clock signals comprises: routing the at least first and second clock signals through a clock-swap block and; causing the clock-swap block to provide the first clock signal on the second channel and the second clock signal on the first channel.

In some embodiments, swapping the first and second clock signals comprises causing a phase interpolator to rotate the first and second clock signals by one-half period.

In some embodiments, the method further comprises swapping the first and second clock signals after applying the at least one second adjustment factor to return the first clock signal to the first channel and the second clock signal to the second channel.

In some embodiments, the method further comprises repeating the steps of determining a skew of the second channel and of applying at least one second adjustment factor to the second channel until the edge of the first clock signal is aligned with the transition point of the reference signal.

In some embodiments, receiving at least first and second clock signals along first and second channels comprises receiving a third clock signal along a third channel, and the method further comprises: swapping the third clock signal and a selected one of the first and second clock signals to provide the selected clock signal on the third channel and the third clock signal on a selected one of the first and second channels; determining, based on a comparison of at least one value of the reference signal sampled by the selected clock signal to at least two values of the reference signal sampled by the third clock signal, a skew of the third channel; and applying at least one third adjustment factor to the third channel based on the determined skew of the third channel.

According to another broad aspect, there is provided a system for correcting clock skew in time-interleaved analog-to-digital converter (TIADC). The system comprises at least one of (a) a memory having stored thereon program code executable by a processor; and at least one processor configured for executing the program code; and (b) a circuit. The at least one of (a) and (b) is configured for receiving at least first and second clock signals along first and second channels, respectively; accounting for a delay of the first channel by applying at least one first adjustment factor to the first and second channels until an edge of the first clock signal is aligned with a transition point of a reference signal; swapping the first and second clock signals to provide the first clock signal on the second channel and the second clock signal on the first channel; determining, based on a comparison of at least one value of the reference signal sampled by the first clock signal to at least two values of the reference signal sampled by the second clock signal, a skew of the second channel; and applying at least one second adjustment factor to the second channel based on the determined skew of the second channel.

In some embodiments, at least one of applying the at least one first adjustment factor and applying the at least one second adjustment factor comprises adjusting at least one of an infinite delay block and a variable delay line.

In some embodiments, adjusting at least one of an infinite delay block and a variable delay line comprises: performing a first adjustment using a master clock and data recovery unit to adjust the infinite delay block; and performing a second adjustment using the variable delay line.

In some embodiments, the reference signal is an output signal of the TIADC.

In some embodiments, the output signal is synchronous with the first and second clock signals.

In some embodiments, swapping the first and second clock signals comprises: routing the at least first and second clock signals through a clock-swap block and; causing the clock-swap block to provide the first clock signal on the second channel and the second clock signal on the first channel.

In some embodiments, swapping the first and second clock signals comprises causing a phase interpolator to rotate the first and second clock signals by one-half period.

In some embodiments, the at least one of (a) and (b) being further configured for swapping the first and second clock signals after applying the second adjustment factor to return the first clock signal to the first channel and the second clock signal to the second channel.

In some embodiments, the at least one of (a) and (b) is further configured for repeating the determining a skew of the second channel and the applying at least one second adjustment factor to the second channel until the edge of the first clock signal is aligned with the transition point of the reference signal.

According to a further broad aspect, there is provided a method for correcting clock skew in time-interleaved analog-to-digital converters. The method comprises receiving first and second clock signals along first and second channels, respectively, the first clock signal having an edge aligned with a transition point of a reference signal; swapping the first and second clock signals to provide the first clock signal on the second channel and the second clock signal on the first channel; determining a skew of the second channel by comparing at least one value of the reference signal sampled by the first clock signal to at least two values of the reference signal sampled by the second clock signal; and applying a skew correction factor to the second channel based on the determined skew.

Features of the systems, devices, and methods described herein may be used in various combinations, and may also be used for the system and computer-readable storage medium in various combinations.

BRIEF DESCRIPTION OF THE DRAWINGS

Further features and advantages of embodiments described herein may become apparent from the following detailed description, taken in combination with the appended drawings, in which.

It will be noted that throughout the appended drawings, like features are identified by like reference numerals.

DETAILED DESCRIPTION

In digital circuits, skew is a problem which affects the synchronous transfer of signals and information across components. Clock skew is a particular type of skew which arises when a common clock is used to set the pace of operation of a plurality of circuit components. If a propagation time of the common clock to the plurality of components varies, the components may not function properly, which may lead to data instability, hold violations, and setup violations, among other issues.

Figure 1:
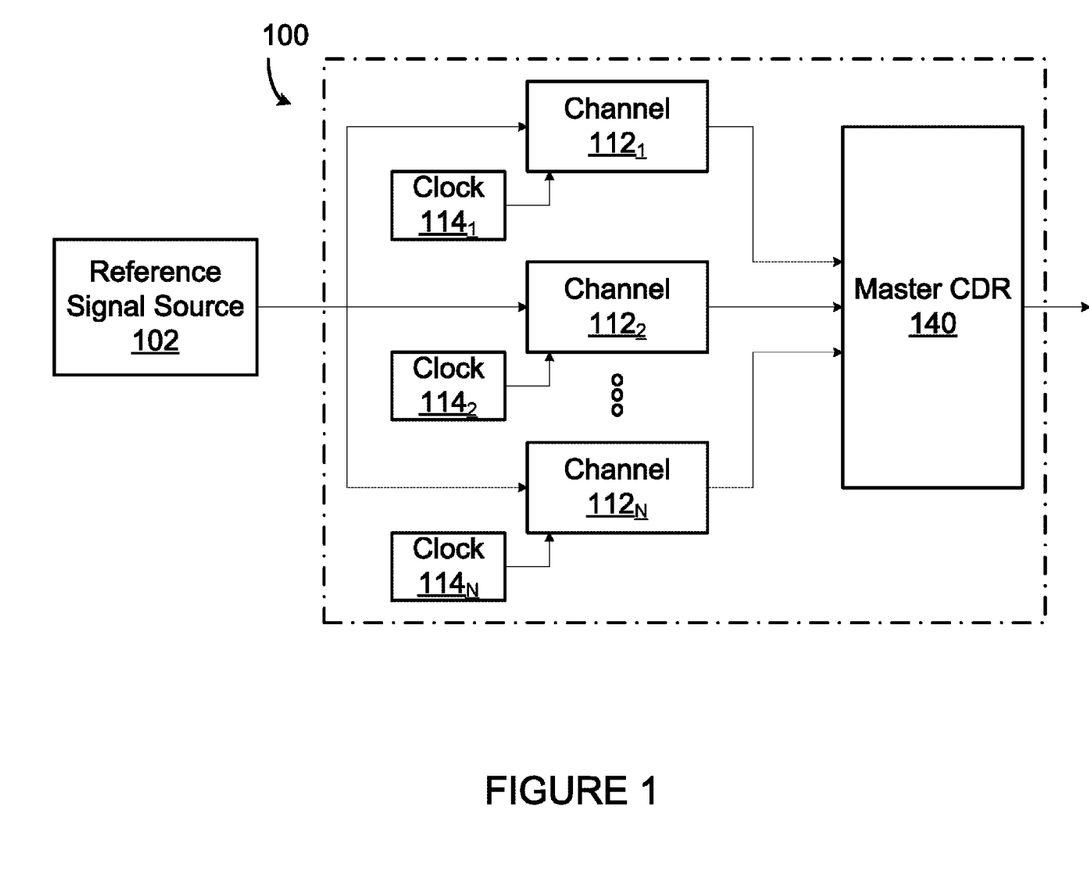
FIG. 1 is a block diagram of an example time-interleaved analog-to-digital converter.

With reference to FIG. 1, clock skew can be particularly problematic to circuits tasked with sampling analog signals, for example time-interleaved analog-to-digital converters (TIADCs). An example TIADC 100 comprises a plurality of channels $112_1$-$112_N$ each provided with a respective clock $114_1$-$114_N$, and a master clock and data recovery unit ("master CDR") 140. The TIADC 100 receives a reference signal from a reference signal source 102. The reference signal is routed to the plurality of channels $112_1$-$112_N$, which sample the reference signal in succession based on their respective clocks $114_1$-$114_N$. The clocks $114_1$-$114_N$ are generated by a common source (not illustrated), described in greater detail hereinbelow.

Each clock $114_1$-$114_N$ operates at a given frequency, which may be common for all clocks $114_1$-$114_N$. For the purposes of skew detection and/or correction, the reference signal used may be a simple synchronous clock pattern with a frequency half that of the clocks $114_1$-$114_N$. Alternatively, the reference signal may have a frequency that is any unit fraction of the frequency of the clocks $114_1$-$114_N$ having an even denominator. The reference signal may be common to each of the channels $112_1$-$112_N$. In some embodiments, the reference signal is an output signal generated by the TIADC 100, or, if the TIADC 100 is part of a larger serializer/deserializer transceiver (not illustrated), an output signal generated by the transceiver. In particular, the output signal of the TIADC 100 or the transceiver may be used because clock domains of the channels $112_1$-$112_N$ and of the TIADC 100 or the transceiver may be based on the same base clock (not illustrated).

In operation, the channel $112_1$ acquires a first value for the reference signal on an edge of the clock $114_1$, and provides the first value to the Master CDR 140. The edge may be a rising edge or a falling edge of the first clock signal, depending on the convention used by the TIADC 100. The clock $114_2$ has an edge offset from the edge of the clock $114_1$: for example, the clock $114_2$ rises slightly after the clock $114_1$. Thus, when clock $114_2$ rises, channel $112_2$ acquires a second value for the reference signal, and provides the second value to the master CDR 140. This process repeats for each of the channels $112_1$-$112_N$, with each clock $114_2$-$114_N$ being offset from a preceding clock and from clock $114_1$. The master CDR 140 stores the values obtained by the channels $112_1$-$112_N$ in any suitable data storage component, or may provide the value to another system (not illustrated).

Figure 2A:
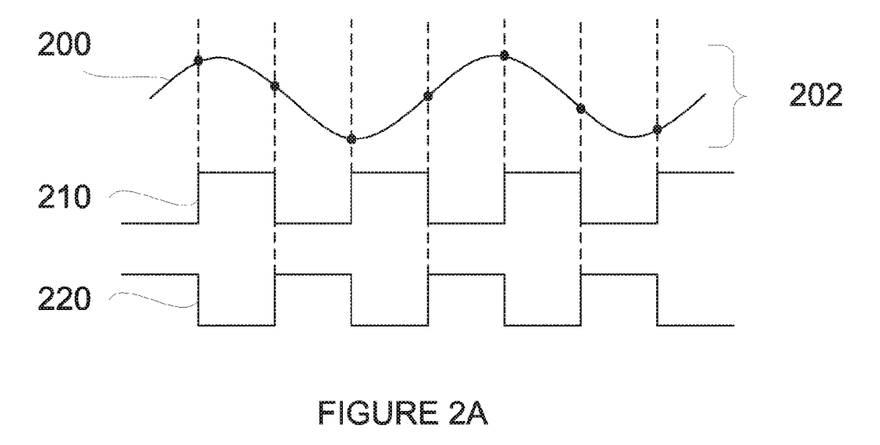
FIG. 2A is an example signal diagram of an analog signal and two clocks.
Figure 2B:
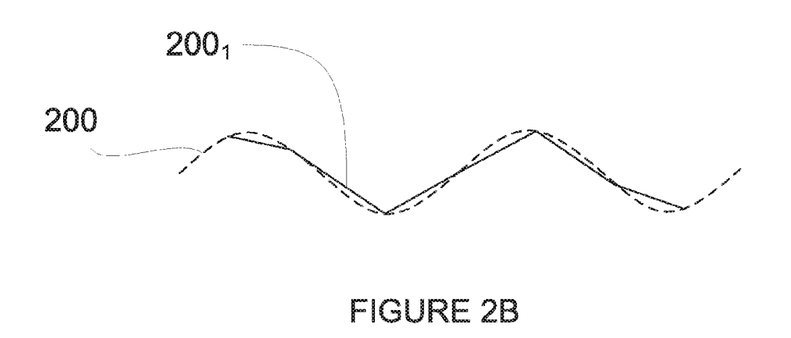
FIG. 2B is an example signal diagram of a sampling of the analog signal of FIG. 1A.

With reference to FIG. 2A, an example TIADC 100 having two channels is used to sample a signal 200. The channels are offset so that a spacing between samplings is substantially even. Thus, the first clock 210 for the first channel and the second clock 220 for the second channel are substantially 180° out of phase. The signal 200 is sampled at points 202, each of which corresponds with either a rising edge of the clock 210 or a rising edge of the clock 220. With reference to FIG. 2B, the points 202 can be combined to create a representation $200_1$ of the signal 200.

Figure 3A:
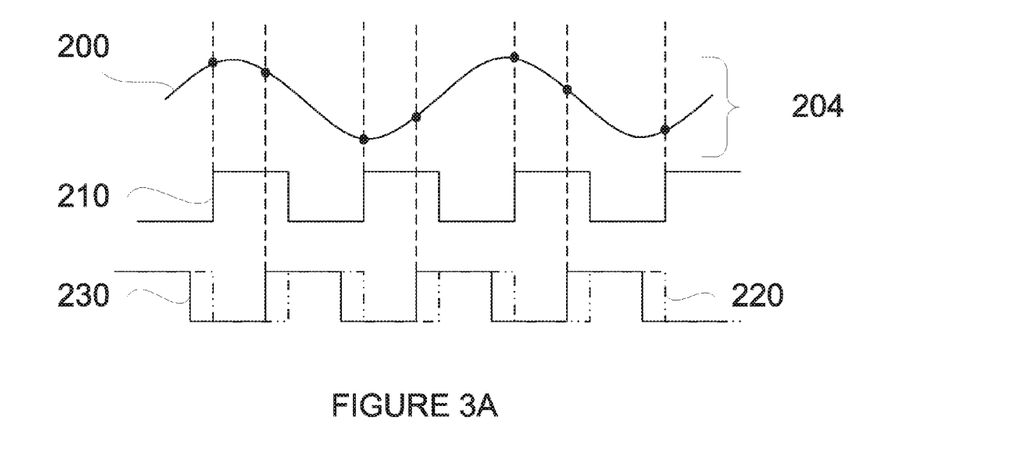
FIG. 3A is an example signal diagram of the analog signal of FIG. 2A and the two clocks, with one clock skewed.
Figure 3B:
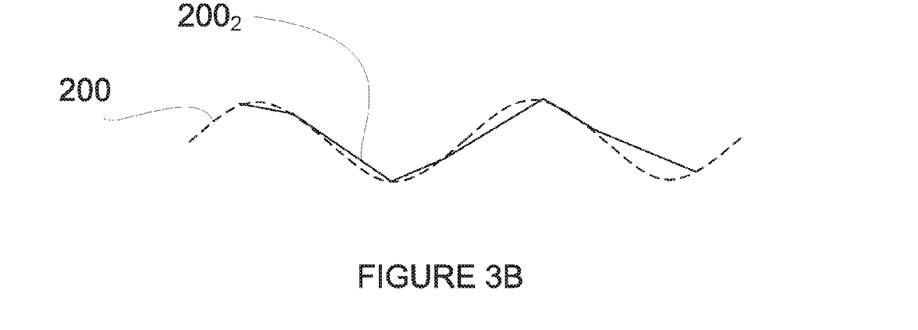
FIG. 3B is an example signal diagram of a skewed sampling of the analog signal of FIG. 2A.

With reference to FIG. 3A, the example sampling of signal 200 is repeated with a third clock 230 replacing the second clock 220. The third clock 230 is skewed vis-à-vis the first clock 210, such that the third clock is less than 180° out of phase. For comparison purposes, an outline of the second clock 220 of FIG. 2A is superimposed over the third clock 230. The skew of clock 230 causes uneven offset between the sampling points 204, which reduces the quality of the sampling. With reference to FIG. 3B, this causes a representation $200_2$ of the signal 200 to be a less accurate approximation of the signal 200 than the representation $200_1$.

Figure 4:
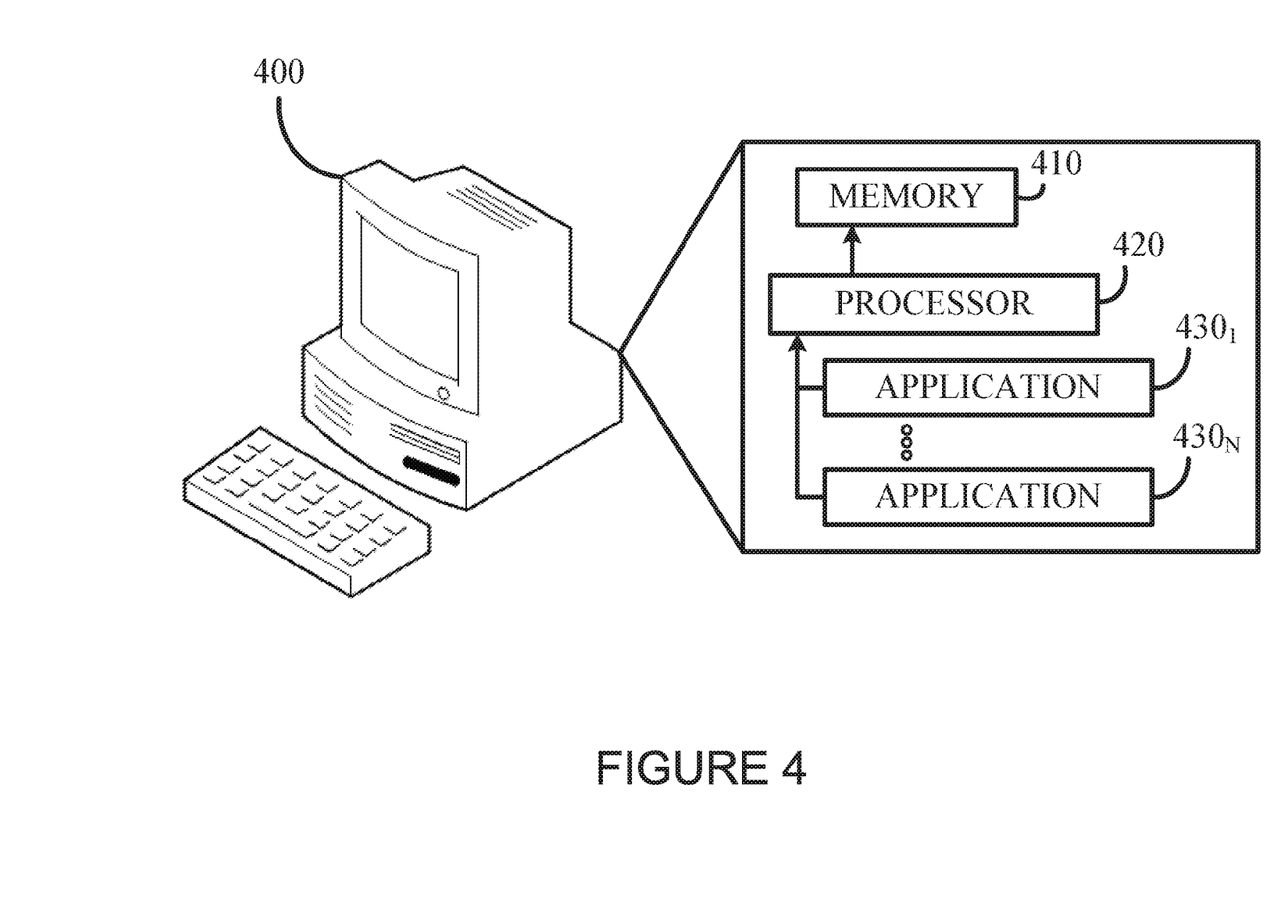
FIG. 4 is a block diagram of an example computer system for implementing a skew correction application.

With reference to FIG. 4, a system for correcting clock skew in a TIADC 100 can be implemented in a computing device 400. The computing device 400 comprises any suitable type of processor 420, for example, any type of general-purpose microprocessor or microcontroller, a digital signal processing (DSP) processor, an integrated circuit, a field programmable gate array (FPGA), a reconfigurable processor, a programmable read-only memory (PROM), or any combination thereof. The computing device 400 also comprises any suitable type of computer memory 410, the computer memory 410 being located internally or externally. For example, the computing device 400 includes random-access memory (RAM), read-only memory (ROM), optical-disc-based read-only memory, electro-optical memory, magneto-optical memory, erasable programmable read-only memory (EPROM), electrically-erasable programmable read-only memory (EEPROM), Ferroelectric RAM (FRAM), and the like. The computing device 400 comprises a network interface (not pictured) in order to communicate with other components, including databases, to access and connect to network resources, and to perform other computing applications by connecting to one or more networks capable of carrying data. In some embodiments, the computing device 400 is implemented in customized digital logic or digital signal processing, which may be controlled by a hardware-based finite state machine, and the like.

The computing device 400 is configured to run or execute any number of applications $430_1$-$430_N$. The applications $430_1$-$430_N$ are stored in the memory 410, and are executed on the processor 420. One such application, for example application $430_1$, implements the system for correcting clock skew in a TIADC. In some embodiments, the application $430_1$ operates within the context of a larger data acquisition system which receives one or more input signals, such as the reference signal, converts the input signals from analog to digital, and performs various signal-processing techniques on the digitized signals. In these embodiments, the application $430_1$ receives the input signals and provides digitized representations of the input signals to further components of the data acquisition system. In other embodiments, the application $430_1$ comprises features in addition to those described hereinbelow to control the operation of the data acquisition system.

Figure 5:
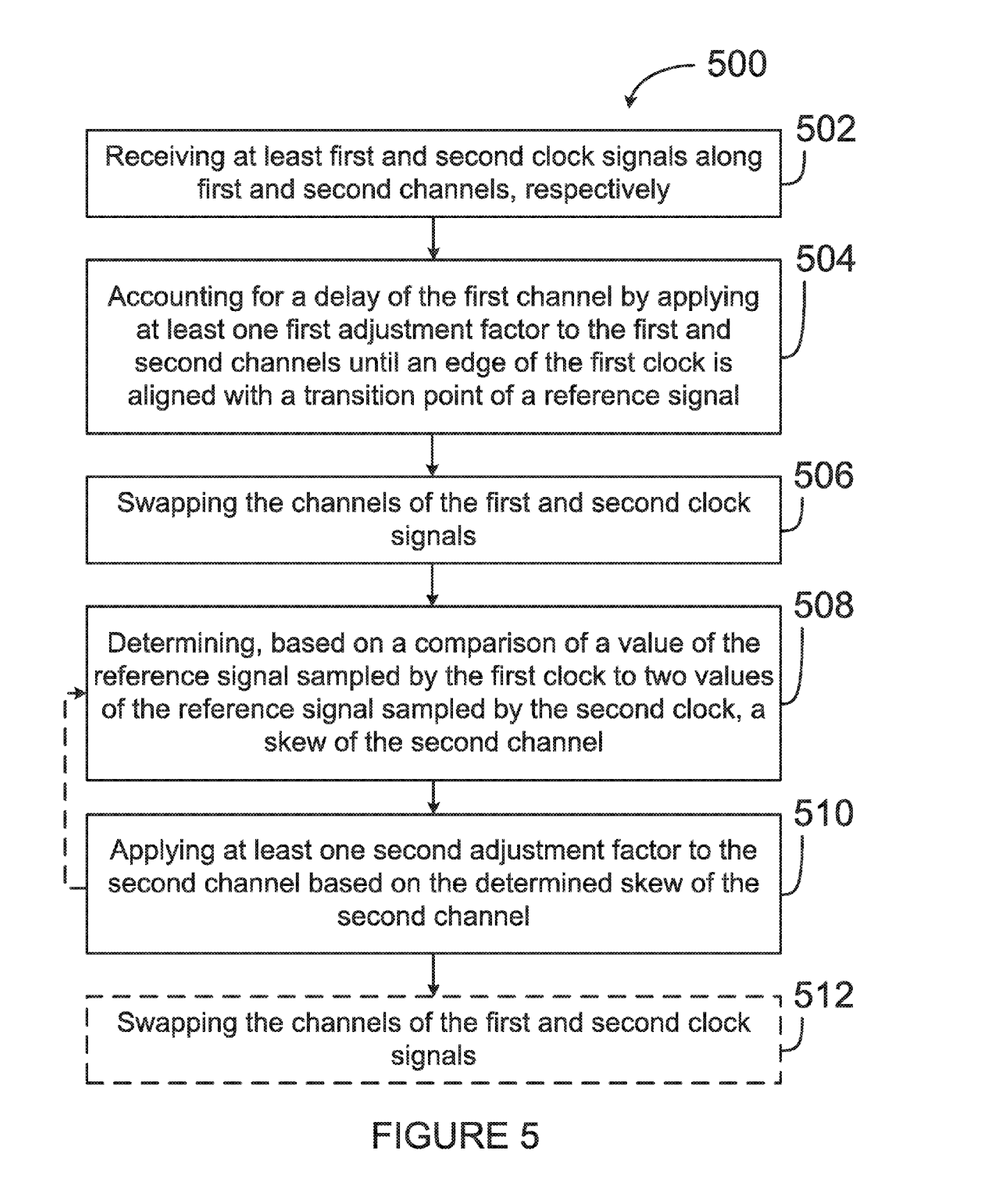
FIG. 5 is a flowchart of a method for correcting clock skew in accordance with an embodiment.

With reference to FIG. 5, the application $430_1$ is configured to implement a method 500 for correcting clock skew in a TIADC, for example TIADC 100. At step 502, at least first and second clock signals (of the first and second clocks $114_1$-$114_2$) are received along respective first and second channels $112_1$-$112_N$. In some embodiments, the TIADC 100 only uses two channels $112_1$, $112_2$ to perform the sampling and only two clock signals are received. If no clock skew is present, the two clocks $114_1$, $114_2$ are exactly 180° out of phase. Alternatively, if no clock skew is present, the two clocks $114_1$, $114_2$ are out of phase by some other suitable amount. In other embodiments, the TIADC 100 uses three or more channels $112_1$-$112_N$ to perform the sampling. In such embodiments, each of the associated three or more clocks $114_1$-$114_N$ are offset from one-another by any suitable value. For example, in a TIADC 100 using four channels $112_1$-$112_4$, each clock $114_1$-$114_4$ is offset by 90°, or by any other suitable value.

For simplicity, the steps of the method 500 are described in the context of a TIADC 100 having two channels $112_1$, $112_2$ and two associated clocks $114_1$, $114_2$. It should be understood that the method is equally applicable to TIADCs 100 having three or more channels $112_1$-$112_N$.

At step 504, a delay of the first channel $112_1$ is accounted for by applying one or more first adjustment factors to the first and second channels $112_1$, $112_2$ until an edge of the first clock signal is aligned with a transition point of a reference signal. The first channel $112_1$ includes any clock buffers, repeaters, and interconnects (not illustrated) along the path from the first clock $114_1$. Variations in interconnect length, width, inductance, capacitance, and the like, can cause lagging or leading effects in the first channel $112_1$. By aligning the edge of the first clock signal with the transition point of a reference signal, any lagging or leading effect of the first channel $112_1$ is effectively cancelled and the first clock $114_1$ is calibrated to the reference signal. By applying the first adjustment factors to both the first and second channels $112_1$, $112_2$, any skew present between the channels $112_1$, $112_2$ is maintained in order to simplify later steps of the method 500. In embodiments where the TIADC 100 has three or more channels $112_1$-$112_N$, the first adjustment factors are applied to each of the channels $112_1$-$112_N$. If the first channel $112_1$ is already aligned with the reference signal, and the method 500 proceeds to step 506.

In some embodiments, the process of accounting for the delay of the first channel $112_1$ is accomplished via a technique called bang-bang clock-and-data recovery, which is described in greater detail hereinbelow. In some embodiments, a representation of the amount of adjustment applied to the first and second (and possibly additional) channels $112_1$-$112_N$ is stored in a memory, such as a hardware register. For example, the delay of the first channel $112_1$ is known to be accounted for when a control code reaches a certain pattern, such as a cyclical pattern. The stored representation may be an average of limit control codes cycles. Alternatively, the stored representation may be a simple time value.

The first adjustment factors are time-domain delays which lag or lead the reception of the first and second clock signals at the first and second channels $112_1$, $112_2$. The first adjustment factors may be of any suitable duration, including a few microseconds, a few nanoseconds, a few picoseconds, a few femtoseconds, and the like. For example, the first adjustment factors are based on the frequency of the clocks $114_1$, $114_2$. The first adjustment factors may be applied via software and/or hardware components. For example, the application $430_1$ directly applies the first adjustment factors to the channels $112_1$, $112_2$ by modifying variables or parameters of the channels $112_1$, $112_2$. Alternatively, the first adjustment factors are applied by hardware components, for example by an infinite delay block and/or a variable delay line, the details of which are described hereinbelow.

In some embodiments, the first adjustment factors are applied in stages. For example, the first adjustment factors include a coarse adjustment factor and a fine adjustment factor. The coarse adjustment factor can be applied before the fine adjustment factor. For example, the coarse adjustment factor is applied by the infinite delay block, and the fine adjustment factor is applied by the variable delay line. In some embodiments, both the coarse adjustment factors and the fine adjustment factors are applied to the first and second channels. In other embodiments, the coarse adjustment factors are applied to both the first and second channels, and the fine adjustment factors are only applied to the first channel.

The reference signal may be any suitable signal to which the first clock $114_1$ can be calibrated. The reference signal may be external to the TIADC 100, or internal thereto. In some embodiments, the reference signal is based or derived on the same global clock source used to generate the ADC clocks. In some embodiments, an output signal can be looped back to an input of the TIADC 100, for example via the reference signal source 102, and used as the reference signal. In some such embodiments, the reference signal is synchronous with the ADC clocks.

At step 506, the channels $112_1$, $112_2$ of the clocks $114_1$, $114_2$ are swapped, such that once step 506 is performed, the first channel $112_1$ is provided with the second clock $114_2$, and the second channel $112_2$ is provided with the first clock $114_1$. Because any skew between channels $112_1$ and $112_2$ is inherent to the clock distribution network within the channels $112_1$, $112_2$ (and not to the clocks $114_1$, $114_2$ themselves), swapping the channels of the first and second clocks $114_1$, $114_2$ allows the first clock $114_1$ on the second channel $112_2$ to be used to lock to the transition point of the reference signal. Since the same clock is used to lock both the first and second channels $112_1$, $112_2$ one at a time to the reference signal, the skew between the first and second channels $112_1$, $112_2$ is represented by any phase/delay difference in the lock position of the first clock $114_1$ on the second channel $112_2$. In some embodiments, in addition to swapping the channels of the clocks $114_1$, $114_2$, outputs from the channels $112_1$, $112_2$ may also be swapped, as discussed in greater detail hereinbelow. In some embodiments, the channel swapping is effected via a clock-swap block, implemented in hardware and/or software, through which the clocks $114_1$, $114_2$, are routed. The clock-swap block has as many inputs and outputs as the number of channels $112_1$-$112_N$ used in the TIADC 100. In other embodiments, the channel swapping is effected by a phase interpolator which rotates the first and second clocks by one-half period, or by any other amount suitable for swapping the clocks $114_1$, $114_2$. In some embodiments where three or more channels $112_1$-$112_N$ are used in the TIADC 100, the phase interpolator rotates the first and second clocks by a suitable amount to cause the clock swap, which may be based on the number of channels N.

In embodiments where the first and second clocks $114_1$, $114_2$ are 180° out of phase, the second clock $114_2$ on the first channel $112_1$ has an edge aligned with a midpoint of the reference signal. The edge may be a rising edge or a falling edge of the second clock signal, depending on the convention used by the TIADC 100. If there is no skew between channels $112_1$, $112_2$, the first clock $114_1$, now on the second channel $112_2$, continues to have the edge aligned with the transition point of the reference signal. However, if skew is present between the channels $112_1$, $112_2$, the edge of the first clock signal is not aligned with the transition point of the reference signal and the first clock signal is skewed.

At step 508, a skew of the second channel, vis-à-vis the first channel, is determined by comparing a value of the reference signal as sampled by the first clock $114_1$, which is on the second channel $112_2$, to two values of the reference signal as sampled by the second clock $114_2$, which is on the first channel $112_1$. Specifically, and with reference to FIGS. 6A-C, the skew of the second channel $112_{22}$ is determined by a process called bang-bang clock-and-data recovery ("BB-CDR").

Figure 6A:
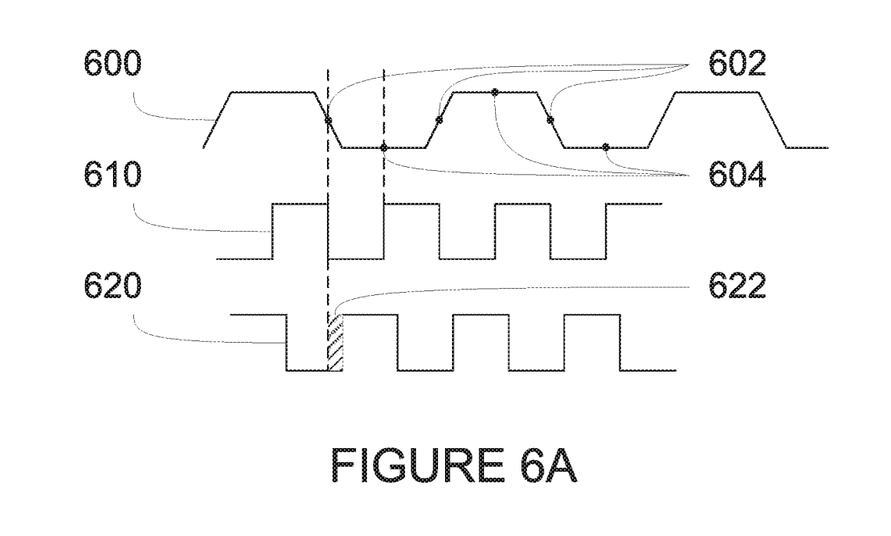
FIGS. 6A-C are signal diagrams illustrating a step of the method of FIG. 5 in accordance with an embodiment.

In FIG. 6A, an example reference signal 600 is shown. The reference signal 600 has transition points 602 and midpoints 604. For the purposes of this example, the edge convention for the clocks $114_1$, $114_2$ is a rising edge convention. The clock signal 610 is analogous to the second clock signal along first channel $112_1$, and has a rising edge aligned with midpoints 604 of the reference signal 600. The clock signal 620 is analogous to the first clock signal along the second channel $112_2$, but is skewed and does not have a rising edge aligned with the transition points 602 of the reference signal 600. The skew of the clock signal 620 is illustrated by the hatched area 622.

Figure 6B:
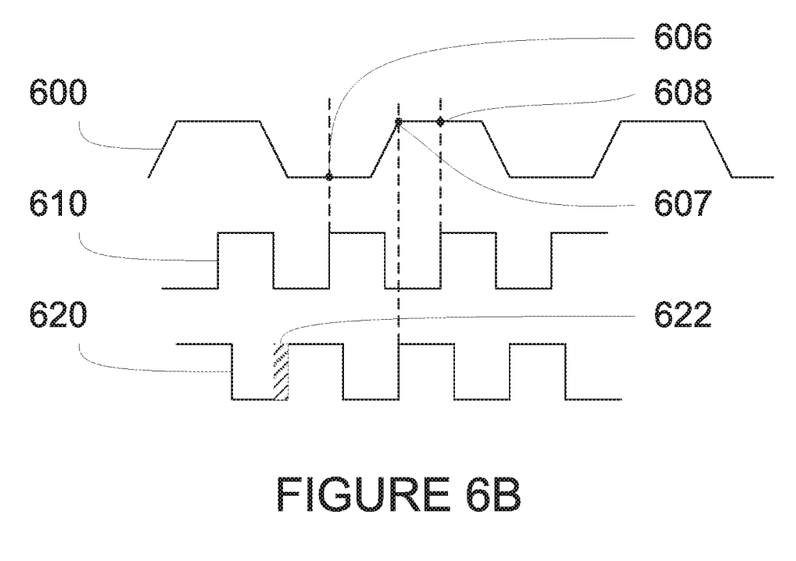

In FIG. 6B, the BB-CDR process is illustrated. The clock signal 610 is used to sample the reference signal 600 on the rising edge of the clock signal 610 to acquire previous value 606. The clock signal 620 is then used to sample the reference signal 600 on the rising edge of the clock signal 620 to acquire trial value 607. The clock signal 610 then samples the reference 600 on a following rising edge to acquire following value 608. The trial value 607 is then compared to the previous and following values 606, 608. In some embodiments, the BB-CDR process compares the most-significant bit (MSB) of the output of the sampling performed by the clocks $114_1$, $114_2$. The following chart illustrates the possible outcomes of the comparison:

TABLE 1

Bang-bang Logic Outcomes

| Previous Value | Trial Value | Following Value | Skew Sign | Decision |
|---|---|---|---|---|
| 0 | 0 | 1 | (−) | Move Right |
| 0 | 1 | 1 | (+) | Move Left |
| 1 | 0 | 0 | (+) | Move Left |
| 1 | 1 | 0 | (−) | Move Right |

Figure 6C:
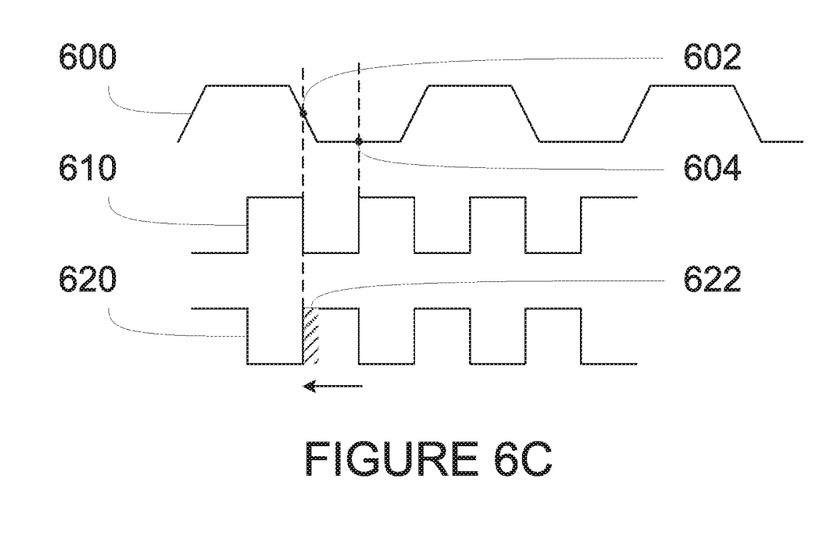

With continued reference to FIG. 5, at step 510 at least one second adjustment factor is applied to the second channel $114_2$, based on the skew of the second channel $114_2$ determined at step 508. The BB-CDR employed at step 508 to determine the sign of the skew indicates whether the at least one second adjustment factor should be applied to cause the second channel $114_1$ to lag (move right) or lead (move left). In the example of FIGS. 6A-C, the previous value reads 0, and both the trial value and the following value read 1. Therefore, in this example, the clock 620 is to be moved to the left, as shown in FIG. 6C. Moving the clock 620 causes the rising edge of the clock 620 to align with the transition point 602, and causes the skew 622 to be corrected. In some embodiments, the skew between the clock paths of each channel is accounted for at least in part by applying a respective control code obtained for the first channel $112_1$.

The amount of the second adjustment factor may vary from one embodiment to another. For example, and with continued reference to FIGS. 6A-C, the amount of the second adjustment may vary based on the frequency of the first clock $112_1$, the frequency of the reference signal 600, or based on any other suitable factor. Additionally, in some embodiments, a single application of a second adjustment factor is not sufficient to align the edge of the first clock signal with the transition point 602 of the reference signal 600. Alternatively, in other embodiments, a single application of a second adjustment factor causes the edge of the first clock signal to overshoot the transition point 602 of the reference signal 600.

Therefore, steps 508 and 510 may be repeated one or more times in succession until the edge of the first clock signal is aligned with the transition point 602 of the reference signal 600. In some embodiments, the second adjustment factors applied the first time, or the first few times, are larger than the second adjustment factors applied in subsequent iterations of steps 508 and 510. In some embodiments, steps 508 and 510 are repeated a set number of times with successively shrinking second adjustment factors. In some other embodiments, steps 508 and 510 are repeated until a certain pattern is met, for example until the BB-CDR produces a predetermined number of opposite outcomes. In further embodiments, steps 508 and 510 are repeated any suitable number of times based on any other suitable factor. The second adjustment factors may be applied in much the same way as the first adjustment factors are applied in step 504. In some embodiments, the adjustment factors applied in step 504 are also determined by way of BB-CDR.

The method 500 optionally includes a step 512 of swapping the channels of the first and second clock signals to return the first clock $114_1$ to the first channel $112_1$ and to return the second clock $114_2$ to the second channel $112_2$. The clock swap of step 512 may be implemented in any suitable way, for example using similar techniques as those described at step 506.

Figure 7:
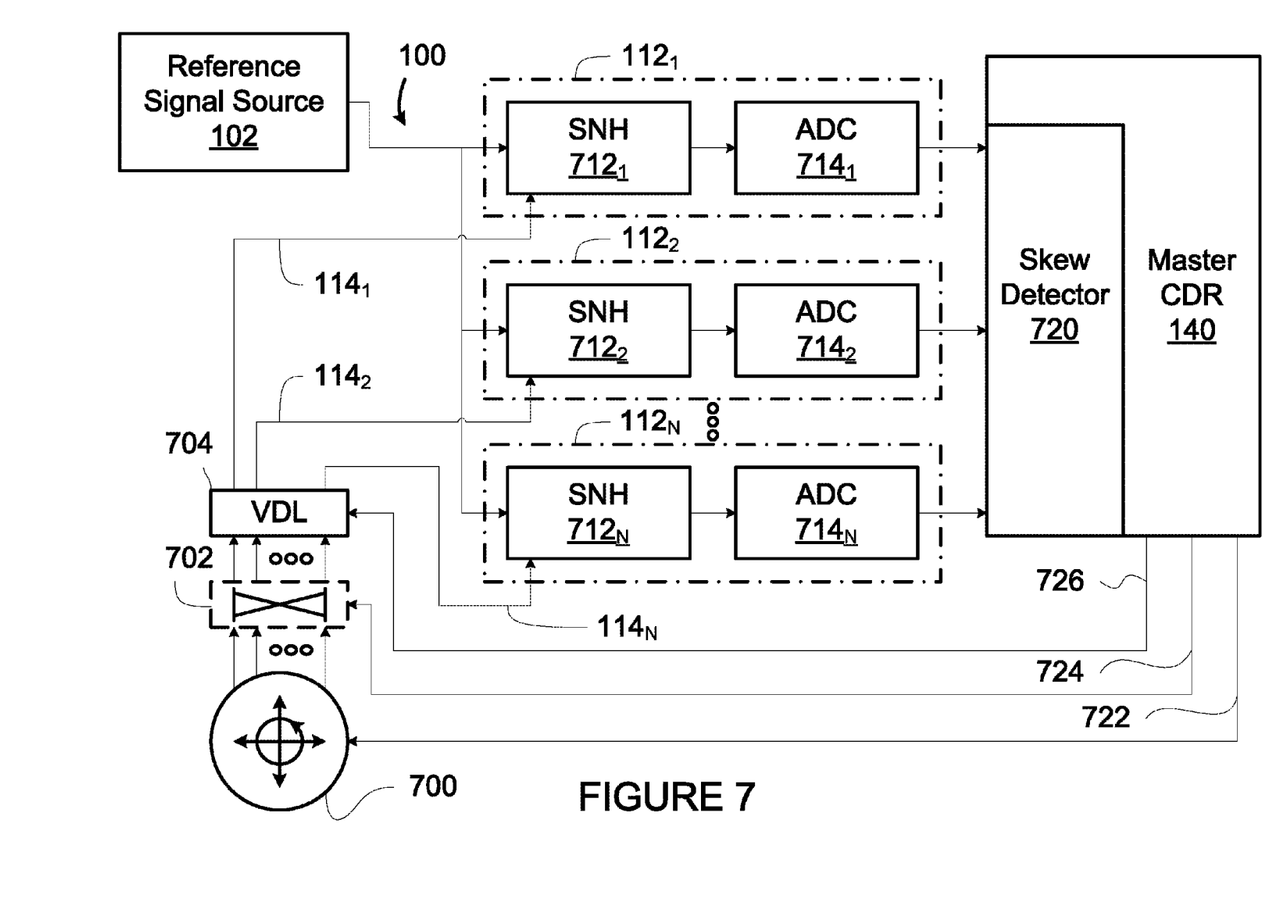
FIG. 7 is a block diagram of an example time-interleaved analog-to-digital converter for implementing the method of FIG. 5.

With reference to FIG. 7, the method 500 can also be implemented by way of an electronic circuit. An embodiment of the TIADC 100 is shown in greater detail. The channels $112_1$-$112_N$ receive respective clocks $114_1$-$114_N$ which are generated by a rotator 700. The rotator 700 can be any suitable clock generating entity, including a piezoelectric oscillator, a tank circuit, an RC circuit, and the like. The rotator 700 can also implement the infinite delay block functionality discussed hereinabove. The clock signals are optionally routed through a clock-swap block 702 having a plurality of input lines and output lines, which can be mapped to one-another in any suitable fashion. The clock signals are also routed through a variable delay line 704 which is configured for applying a variable delay to each of the clock signals. Though the clocks $114_1$-$114_N$ are represented here by lines, it should be understood that the generation of the clocks $114_1$-$114_N$ takes place in the rotator 700 and that the lines are merely used to transmit the clocks $114_1$-$114_N$ to the channels $112_1$-$112_N$.

Each of the channels $112_1$-$112_N$ includes a respective sample-and-hold block ("SNH") $712_1$-$712_N$ and a respective ADC $714_1$-$714_N$. The channels $112_1$-$112_N$ receive the reference signal from the reference signal source 102 and the clock signals from the clocks $114_1$-$114_N$, in accordance with step 502 of the method 500. More specifically, the SNHs $712_1$-$712_N$ receive the reference signal from the reference signal source 102 and receive a respective clock signal from clocks $114_1$-$114_N$. On every clock cycle, or every suitable number of clock cycles, the SNHs $712_1$-$712_N$ sample the reference signal and hold a value of the reference signal until the respective ADC $714_1$-$714_N$ converts the held value to a digital value. Since the clocks $114_1$-$114_N$ are each mutually offset, each of the SNH $712_1$-$712_N$ samples the reference signal at a different time, and the ADCs $714_1$-$714_N$ digitize the held value and provide the digital value to the master CDR 140. The particular representation used when digitizing the held value of the reference signal may vary from one implementation to another, and may use any suitable number of bits.

The master CDR 140 is configured for implementing steps 504 to 512 of the method 500. The master CDR 140 has a skew detector 720 and a plurality of control lines, including rotator control line 722, clock-swap control line 724, and variable delay control line 726, for providing instructions to the rotator 700, the clock-swap block 702, and the variable delay line 704, respectively. The master CDR is also configured for receiving the digital values from the channels $112_1$-$112_N$. In some embodiments, the skew detector 702 acts as an interface for receiving the digital values from the channels $112_1$-$112_N$. In other embodiments, the digital values are provided to both the master CDR 140 and the skew detector 720 along separate paths (not illustrated).

Figure 8:
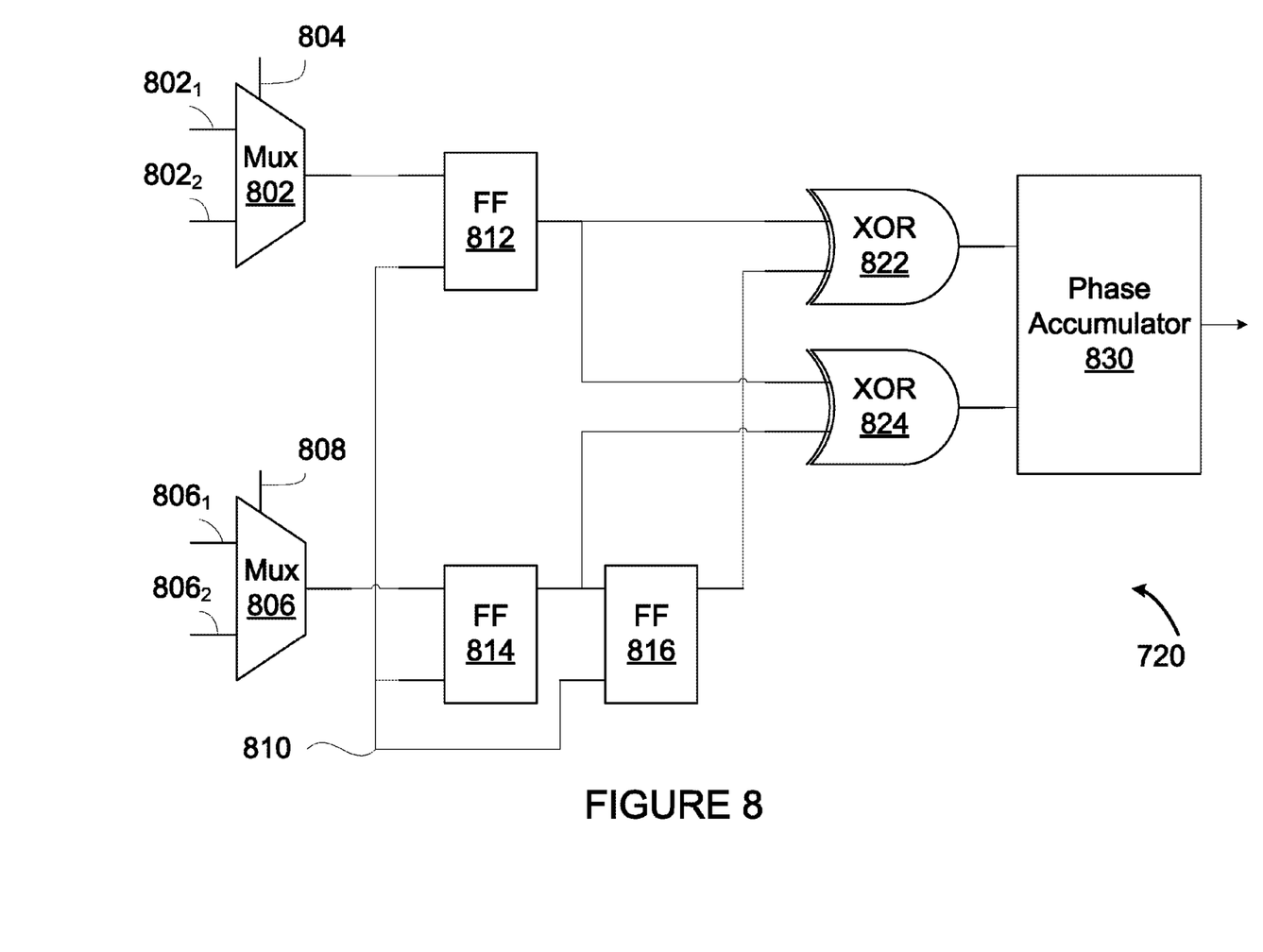
FIG. 8 is a block diagram of an example implementation of the skew detector of FIG. 7 for implementing the step of FIGS. 6A-C.

With reference to FIG. 8, an example skew detector 720 for an example two-channel TIADC 100 is composed of multiplexers ("mux") 802, 806, flip-flops 812, 814, 816, exclusive-or ("XOR") gates 822, 824, and a phase accumulator 830. The multiplexers 802, 806, have respective data lines $802_1$-$802_2$, $806_1$-$806_2$, and respective select lines 804, 808. The data lines $802_1$-$802_2$, $806_1$-$806_2$ are configured for receiving the digital values from channels $112_1$, $112_2$, such that each multiplexer 802, 806 receives both digital values. For example, multiplexer 802 receives the most significant bit of the digital value from channel $112_1$ on data line $802_1$, and receives the most significant bit of the digital value from channel $112_2$ on data line $802_2$. Similarly, multiplexer 806 receives the most significant bit of the digital value from channel $112_1$ on data line $806_1$, and receives the most significant bit of the digital value from channel $112_2$ on data line $806_2$. The select lines 804, 808 are configured for indicating to the multiplexers 802, 806, which of the data lines is to be selected and propagated to the rest of the skew detector 720 circuit.

The flip-flops 812, 814, 816 are provided a common clock 810, which may be the first clock $114_1$, the second clock $114_2$, or any other suitable clock. The flip-flop 812 is configured to latch the trial value received from the multiplexer 802 and to propagate the trial value to the XOR gates 822, 824. The flip-flop 814 is configured to latch the following value and to propagate the following value to the XOR gate 824 and to the flip-flop 816. Since propagating the following value from the flip-flip 814 to the flip-flop 816 requires one clock-cycle, the flip-flop 816 latches the previous value, which is the following value from the preceding clock cycle. The flip-flop 816 is also configured to provide the previous value to the XOR gate 822. The XOR gates 822, 824 are configured to implement the BB-phase detector and to provide results of the phase comparison to the phase accumulator 830. The phase accumulator 830 is configured for providing an indication to the master CDR 140 regarding the skew of the channels $112_1$, $112_2$ of the TIADC 100.

In embodiments where the TIADC 100 includes three or more channels $112_1$-$112_N$, the multiplexers 802, 806 include additional data lines and the select lines 804, 808 are wider to accommodate the additional data lines. Alternatively, additional multiplexers are provided in cascade to accommodate the additional digital values from the channels $112_1$-$112_N$, with a commensurate number of additional associated select lines. Alternatively still, the skew detector 720 can be modified in other ways to accommodate additional channels $112_1$-$112_N$.

To implement step 504 of the method 500, the master CDR 140 uses the skew detector 720 to determine the first adjustment factors to apply to the first clock $114_1$ in order to align the edge of the first clock $114_1$ with the transition point 602 of the reference signal 600. The master CDR 140 then instructs the rotator 700 via the rotator control line 722 and/or the variable delay line 704 via variable delay control line 726 to apply the first adjustment factors. In some embodiments, the rotator 700 is instructed to apply coarse adjustment factors and the variable delay line 704 is instructed to apply fine adjustment factors.

To implement step 506, the master CDR 140 instructs the rotator 700 or the clock-swap block 702 to swap the channels $112_1$, $112_2$, of the first and second clock signals. In embodiments where the swapping is performed via the rotator 700, instructions from the master CDR 140 are provided over rotator control line 722 to a phase interpolator (not pictured) of the rotator 700, which rotates the clock signals by a suitable amount. In embodiments where the swapping is performed via the clock-swap block 702, instructions from the master CDR 140 are provided over clock-swap control line 724 to the clock-swap block 702, which swaps the channels $112_1$, $112_2$ of the clock signals.

To implement steps 508 and 510, the master CDR 140 uses the skew detector 720 to obtain the previous, trial, and following values and to apply the BB-CDR to determine the skew of the second channel $112_2$. The master CDR 140 then instructs the rotator 700 via the rotator control line 722 and/or the variable delay line 704 via variable delay control line 726 to apply the second adjustment factors. The master CDR is configured to repeat steps 508 and 510, as described hereinabove, until the edge of the first clock signal is aligned with the transition point 602 of the reference signal 600. In some embodiments, the implementation of step 504 by the master CDR is accomplished much in the same way as the implementation of steps 508 and 510 by the master CDR. Step 512 can be implemented in substantially the same fashion as step 506.

To correct any skew of channels subsequent to first and second channels $112_1$, $112_2$, for example a third channel $112_3$ carrying a third clock $114_3$, step 512 is first executed to return the clocks $114_1$, $114_2$ to original channels $112_1$, $112_2$, respectively. Then, with reference to FIG. 9, a modified version of the method 500, namely method 900, is performed. The method 900 may be performed by the application $430_1$ or by the circuit of FIG. 7, or by any other suitable means, including a hardware-based finite-state machine.

Figure 9:
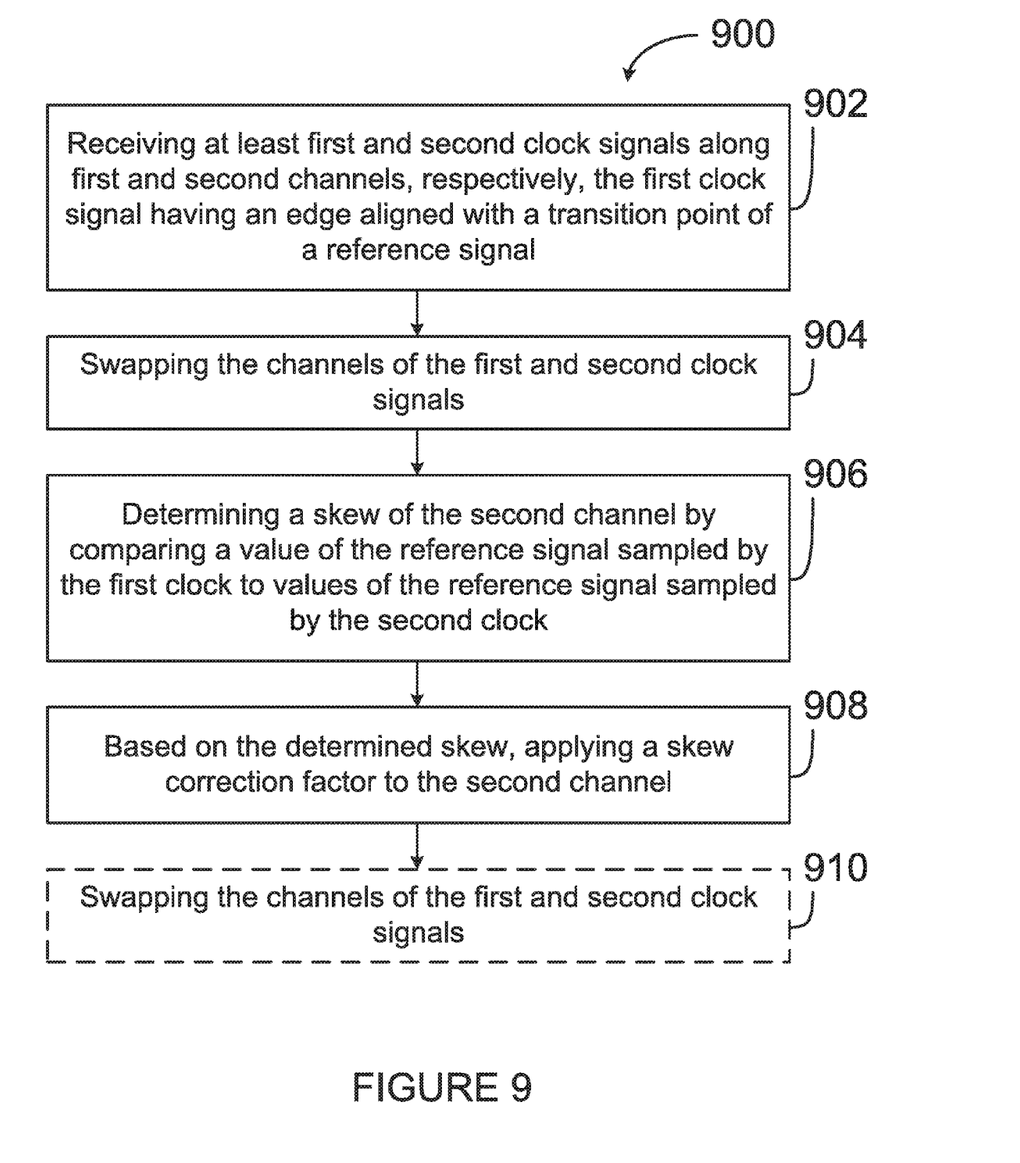
FIG. 9 is a flowchart of a method for correcting clock skew in accordance with an embodiment.

At step 902, two clock signals are received along respective channels. One of the clock signals has an edge aligned with a transition point 602 of a reference signal 600, and may be any skew-corrected clock signal, for example the first clock signal or the second clock signal. The other clock signal may be any uncorrected clock signal, for example a third clock signal provided by a third clock $114_3$, which is received along a third channel $112_3$, an as-of-yet uncorrected channel.

At step 904, the channels of the skew-corrected and uncorrected clock signals are swapped. The channels of the clock signals may be swapped in any suitable fashion.

At step 906, a skew of the uncorrected channel is determined using the BB-CDR to compare the trial value, sampled by the uncorrected clock, to the previous and following values, sampled by the skew-corrected clock.

At step 908, a skew correction factor is applied to the uncorrected channel based on the skew determined at step 906. The skew correction factor may be applied in any suitable fashion.

The method 900 optionally includes step 910 of swapping the channels of the clocks to return the clocks to their original channels. The method 900 can be repeated for each uncorrected channel present in the TIADC 100.

Although the methods and systems described herein are applicable to many applications which use TIADCs, one particular application is in high channel density serial communication integrated circuits (ICs). These types of ICs are commonplace in many networking applications. For example, the TI-ADC is a sub-component within a single serializer/deserializers (SerDes) transceiver. Many transceiver blocks are then integrated within a larger integrated circuit (e.g. the serial communication IC as described above).

In some ICs, a very high number of SerDes transceivers can be used in a single chip such as in 'switch fabrics', where up to 200 individual channels are used. There can be so many channels that the overall area of the IC can become 'I/O limited'. An I/O limited IC is an IC where the silicon cost increases as a result of needing more area or periphery for transceivers, and is generally undesirable. The methods and systems for skew detection and correction described herein may help to reduce I/O footprint, and by extension hardware costs, and may avoid some of the input signal limitations of the prior art solutions.

The skew correction application $430_1$ described herein may be implemented in a high level procedural or object oriented programming or scripting language, or a combination thereof, to communicate with or assist in the operation of a computer system, for example the computing device 400. Alternatively, the skew correction application $430_1$ may be implemented in assembly or machine language. The language may be a compiled or interpreted language. Program code for implementing the skew correction application $430_1$ may be stored on a storage media or a device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein. Embodiments of the skew correction application $430_1$ may also be considered to be implemented by way of a non-transitory computer-readable storage medium having a computer program stored thereon. The computer program may comprise computer-readable instructions which cause a computer, or more specifically the at least one processing unit of the computer, to operate in a specific and predefined manner to perform the functions described herein. The computer program may be implemented in a hardware-based finite-state machine.

Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

Various aspects of the skew correction application $430_1$ and/or the methods 500, 900 herein-disclosed may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the preferred embodiments set forth in the examples, but should be given the broadest reasonable interpretation consistent with the description as a whole.

What is claimed is:

1. A method for correcting clock skew in a time-interleaved analog-to-digital converter (TIADC), comprising:
   receiving at least first and second clock signals along first and second channels, respectively;
   accounting for a delay of the first channel by applying at least one first adjustment factor to the first and second channels until an edge of the first clock signal is aligned with a transition point of a reference signal;
   swapping the first and second clock signals to provide the first clock signal on the second channel and the second clock signal on the first channel;
   determining, based on a comparison of at least one value of the reference signal sampled by the first clock signal to at least two values of the reference signal sampled by the second clock signal, a skew of the second channel; and
   applying at least one second adjustment factor to the second channel based on the determined skew of the second channel.

2. The method of claim 1, wherein at least one of applying the at least one first adjustment factor and applying the at least one second adjustment factor comprises adjusting at least one of an infinite delay block and a variable delay line.

3. The method of claim 2, wherein adjusting at least one of an infinite delay block and a variable delay line comprises:
   performing a first adjustment using a master clock and data recovery unit to adjust the infinite delay block; and
   performing a second adjustment using the variable delay line.

4. The method of claim 1, wherein the reference signal is an output signal of the TIADC.

5. The method of claim 4, wherein the output signal is synchronous with the first and second clock signals.

6. The method of claim 1, wherein swapping the first and second clock signals comprises:
   routing the at least first and second clock signals through a clock-swap block and;
   causing the clock-swap block to provide the first clock signal on the second channel and the second clock signal on the first channel.

7. The method of claim 1, wherein swapping the first and second clock signals comprises causing a phase interpolator to rotate the first and second clock signals by one-half period.

8. The method of claim 1, further comprising returning the first clock signal to the first channel and the second clock signal to the second channel after applying the at least one second adjustment factor.

9. The method of claim 1, further comprising repeating the determining a skew of the second channel and the applying at least one second adjustment factor to the second channel until the edge of the first clock signal is aligned with the transition point of the reference signal.

10. The method of claim 1, wherein receiving at least first and second clock signals along first and second channels comprises receiving a third clock signal along a third channel, the method further comprising:
    swapping the third clock signal and a selected one of the first and second clock signals to provide the selected clock signal on the third channel and the third clock signal on a selected one of the first and second channels;
    determining, based on a comparison of at least one value of the reference signal sampled by the selected clock signal to at least two values of the reference signal sampled by the third clock signal, a skew of the third channel; and
    applying at least one third adjustment factor to the third channel based on the determined skew of the third channel.

11. A system for correcting clock skew in time-interleaved analog-to-digital converter (TIADC), comprising:
    at least one of:
    (a) a memory having stored thereon program code executable by a processor; and
    at least one processor configured for executing the program code; and
    (b) a circuit;
    the at least one of (a) and (b) configured for:
    receiving at least first and second clock signals along first and second channels, respectively;
    accounting for a delay of the first channel by applying at least one first adjustment factor to the first and the second channels until an edge of the first clock signal is aligned with a transition point of a reference signal;
    swapping the first and second clock signals to provide the first clock signal on the second channel and the second clock signal on the first channel;

determining, based on a comparison of at least one value of the reference signal sampled by the first clock signal to at least two values of the reference signal sampled by the second clock signal, a skew of the second channel; and applying at least one second adjustment factor to the second channel based on the determined skew of the second channel.

12. The system of claim 11, wherein at least one of applying the at least one first adjustment factor and applying the at least one second adjustment factor comprises adjusting at least one of an infinite delay block and a variable delay line.

13. The system of claim 12, wherein adjusting at least one of an infinite delay block and a variable delay line comprises:

performing a first adjustment using a master clock and data recovery unit to adjust the infinite delay block; and performing a second adjustment using the variable delay line.

14. The system of claim 11, wherein the reference signal is an output signal of the TIADC.

15. The system of claim 14, wherein the output signal is synchronous with the first and second clock signals.

16. The system of claim 11, wherein swapping the first and second clock signals comprises:

routing the at least first and second clock signals through a clock-swap block and;

causing the clock-swap block to provide the first clock signal on the second channel and the second clock signal on the first channel.

17. The system of claim 11, wherein swapping the first and second clock signals comprises causing a phase interpolator to rotate the first and second clock signals by one-half period.

18. The system of claim 11, the at least one of (a) and (b) being further configured for returning the first clock signal to the first channel and the second clock signal to the second channel after applying the second adjustment factor.

19. The system of claim 11, the at least one of (a) and (b) being further configured for repeating the determining a skew of the second channel and the applying at least one second adjustment factor to the second channel until the edge of the first clock signal is aligned with the transition point of the reference signal.

20. A method for correcting clock skew in time-interleaved analog-to-digital converters, comprising:

receiving first and second clock signals along first and second channels, respectively, the first clock signal having an edge aligned with a transition point of a reference signal;

swapping the first and second clock signals to provide the first clock signal on the second channel and the second clock signal on the first channel;

determining a skew of the second channel by comparing at least one value of the reference signal sampled by the first clock signal to at least two values of the reference signal sampled by the second clock signal; and applying a skew correction factor to the second channel based on the determined skew.

* * * * *